(12) United States Patent
Wang et al.

(10) Patent No.: US 7,804,162 B2
(45) Date of Patent: Sep. 28, 2010

(54) MULTI-WAVELENGTH WHITE LIGHT-EMITTING STRUCTURE

(75) Inventors: Bily Wang, Hsin Chu (TW); Jonnie Chuang, Pan Chiao (TW); Chuan-Fa Lin, Shu Lin (TW)

(73) Assignee: Harvatek Corporation, Hsin Chu (TW)

( * ) Notice: Subject to any disclaimer, the term of this patent is extended or adjusted under 35 U.S.C. 154(b) by 58 days.

(21) Appl. No.: 12/379,258

(22) Filed: Feb. 18, 2009

(65) Prior Publication Data

US 2009/0152574 A1 Jun. 18, 2009

Related U.S. Application Data

(63) Continuation-in-part of application No. 11/416,144, filed on May 3, 2006, now abandoned.

(51) Int. Cl.
*H01L 23/02* (2006.01)
*H01J 1/62* (2006.01)
*H01J 63/04* (2006.01)
*F21V 9/00* (2006.01)

(52) U.S. Cl. .................. 257/678; 313/500; 362/231

(58) Field of Classification Search ................. 257/678; 313/485, 500; 362/2, 612, 230, 231, 311.02
See application file for complete search history.

(56) References Cited

U.S. PATENT DOCUMENTS

| 7,132,785 | B2 * | 11/2006 | Ducharme | .................. 313/501 |
| 7,367,692 | B2 * | 5/2008 | Maxik | ......................... 362/307 |
| 2004/0218387 | A1 * | 11/2004 | Gerlach | ...................... 362/231 |

* cited by examiner

*Primary Examiner*—W. David Coleman
(74) *Attorney, Agent, or Firm*—Rosenberg, Klein & Lee

(57) ABSTRACT

A multi-wavelength white light-emitting structure uses a UV light emitting diode chip and a blue light emitting diode chip to excite a red phosphor and a green phosphor and generates a white light-emitting structure having good color rendering. The multi-wavelength white light-emitting structure uses a UV light emitting diode chip that emits light having a wavelength of between 350~430 nm to excite a red phosphor to emit red light having a wavelength of between 600~700 nm. The present invention then uses a blue light emitting diode chip that emits light having a wavelength between of 400~500 nm to emit blue light and uses the blue light emitting diode chip to excite a green phosphor to emit green light having a wavelength of between 490~560 nm. Mixing the red light, the blue light and the green light forms a white light.

13 Claims, 4 Drawing Sheets

MULTI-WAVELENGTH WHITE LIGHT-EMITTING STRUCTURE

CROSS REFERENCE TO RELATED APPLICATION

This application is a continuation-in-part of U.S. application Ser. No. 11/416,144, filed on 3 May 2006 now abandoned and entitled "multi-wavelength white light-emitting structure".

BACKGROUND OF THE PRESENT INVENTION

1. Field of the Present Invention

The present invention relates to a white light-emitting structure, in particular to a multi-wavelength white light-emitting structure for generating good color rendering.

2. Description of the Related Art

Technological developments with light emitting diodes (LEDs), such as the improvement of their quality, efficiency, life and color rendering, have led to LEDs being all around us—they are commonly applied in, for example, traffic signs, cell phones, Christmas ornaments and lighting apparatuses, etc. Currently, a white light-emitting structure cannot be produced by directly using a light emitting diode chip that emits white light. The general method uses a light emitting diode chip that emits color light and excites a phosphor having a specified wavelength. These two wavelength lights are then mixed to emit white light.

To produce a white light-emitting structure, one method combines a red light emitting diode chip, a green light emitting diode chip and a blue light emitting diode chip with a predetermined ratio. Another method uses a blue light emitting diode chip or a UV light emitting diode chip and a specified phosphor.

FIG. 1 shows U.S. Pat. No. 5,998,925, titled "Light Emitting Device Having A Nitride Compound Semiconductor And A Phosphor Containing A Garnet Fluorescent Material." The present invention uses a nitride compound semiconductor to emit blue light and excites a phosphor containing a garnet fluorescent material to emit yellow light. The blue light and the yellow light are then mixed to emit white light. The light emitting device comprises a phosphor 10a, a light emitting element 11a, a connecting wire 12a, a protection mask 13a and two conducting-wire pins 14a and 15a.

TW publication patent No. 200417064, titled "A Method For Producing A White light-emitting structure Source Excited By A UV Light" is another prior art. A white light is produced by using a yellow-white phosphor that has a flat-broad wavelength band and is excited by a UV light emitting diode chip (with a wavelength of between 380~400 nm), and a blue light emitting diode chip.

The white light-emitting structure of the prior art uses a blue light emitting diode to excite a yellow phosphor and generates a yellow light. The yellow light and the blue light are then mixed to emit high luminance white light. When the white light-emitting structure is used as a lighting apparatus any objects upon which it shines will have a yellow or blue tint.

In order to improve the color rendering, the prior art adopted a UV light emitting diode to excite a red phosphor, a green phosphor and a blue phosphor. When we select the phosphors with an appropriate ratio to emit white light, it is necessary to meet a condition—the exciting light must be absorbable by these phosphors and the absorbability index of the phosphors must be similar. This requirement increases the difficulty of choosing suitable phosphors.

SUMMARY OF THE PRESENT INVENTION

One aspect of the present invention provides a multi-wavelength white light-emitting structure that uses a UV light emitting diode chip and a blue light emitting diode chip to excite a red phosphor and a green phosphor and generates a white light-emitting structure. The multi-wavelength white light-emitting structure of the present invention increases number of options available when choosing phosphors and enhances color rendering and lighting efficiency.

In order to achieve the above-mentioned objectives, the present invention provides a multi-wavelength white light-emitting structure, including: a lampshade, a plurality of UV light emitting diode chips, a plurality of blue light emitting diode chips, a plurality of wires and a phosphor board. The lampshade has a body and a plurality of reflective layers formed on an inner surface of the body and separated from each other. The UV light emitting diode chips are respective electrically disposed on one part of the reflective layers. The blue light emitting diode chips are respective electrically disposed on other part of the reflective layers. The UV light emitting diode chips and the blue light emitting diode chips are alternately arranged on the reflective layers. Each wire is transversely electrically connected between each light emitting diode chip and each next reflective layer, so that each transverse row of the light emitting diode chips is series-wound in order to a multiple-series connection. The phosphor board is disposed on the body of the lampshade.

For further understanding of the present invention, reference is made to the following detailed description illustrating the embodiments and examples of the present invention. The description is only for illustrating the present invention and is not intended to be considered limiting of the scope of the claim.

BRIEF DESCRIPTION OF THE DRAWINGS

The drawings included herein provide a further understanding of the present invention. A brief introduction of the drawings is as follows.

DETAILED DESCRIPTION OF THE PREFERRED EMBODIMENTS

Figure 1:
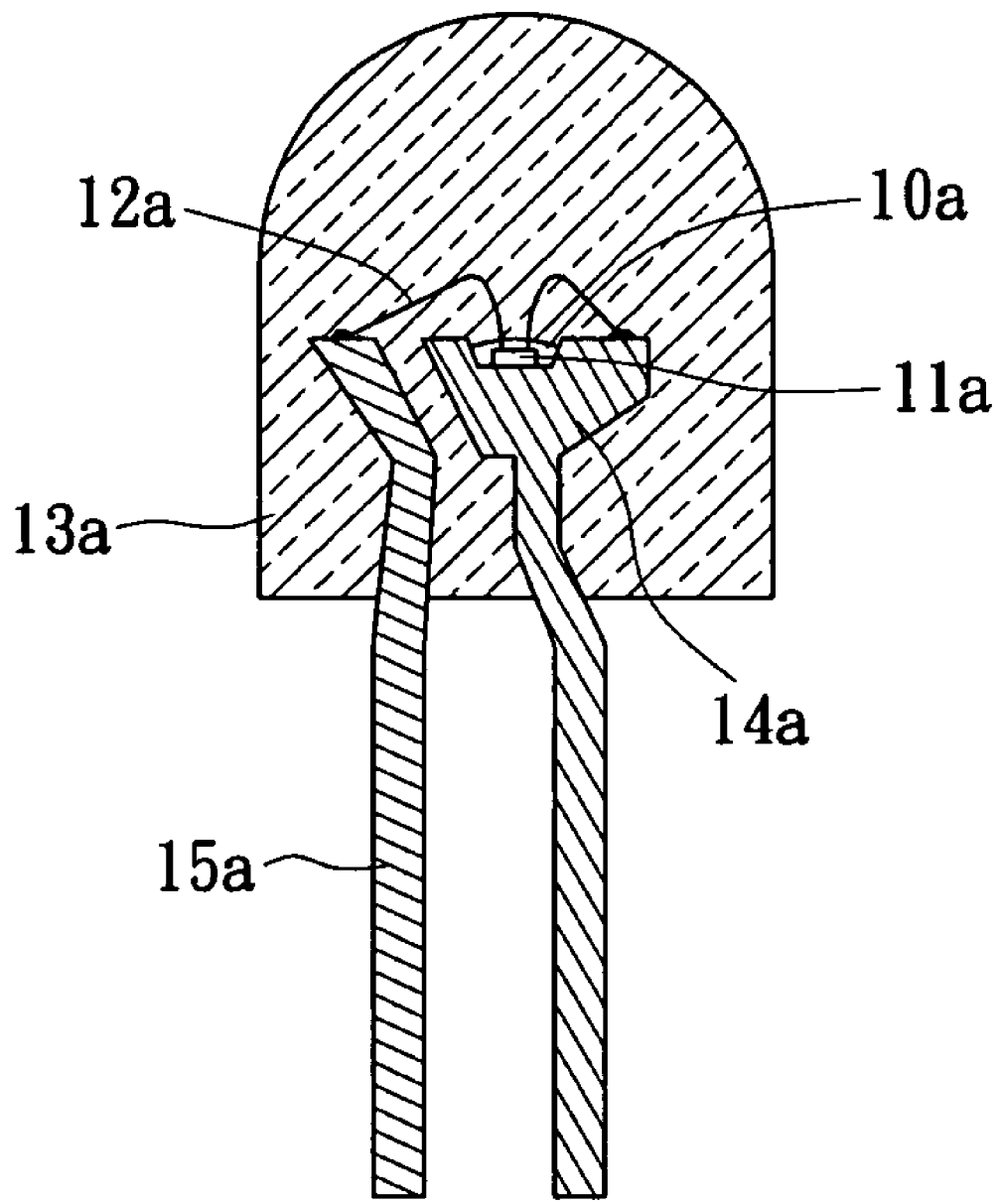
FIG. 1 is a schematic diagram of a white light-emitting structure of the prior art.

The first embodiment of a multi-wavelength white light-emitting structure of the present invention uses a UV light emitting diode chip that emits light having a wavelength between 350~430 nm to excite a red phosphor to emit red light having a wavelength between 600~700 nm. The present invention then uses a blue light emitting diode chip that emits light having a wavelength between 400~500 nm to emit blue light. The blue light emitting diode chip that emits light having a wavelength between 400~500 nm is then used to excite a green phosphor to emit green light having a wavelength between 490~560 nm. Mixing the red light, the blue light and the green light forms a white light.

The UV light emitting diode chip and the blue light emitting diode chip are made of a nitride compound semiconductor. The UV light emitting diode chip and the blue light emitting diode chip can be separated or integrated into a bi-wavelength single chip.

The chemical composition of red phosphor is $Y2O2S:Eu$, $YVO4:Eu$, $Y(V,P,B)O4:Eu$, $YnbO4:Eu$, $YtaO4:Eu$ or other phosphors that can be excited by UV light to emit red light. The chemical composition of green phosphor is $SrGa_2S_4:Eu$, $Ca_8EuMnMg(SiO_4)C_{12}$ or other phosphors that can be excited by blue light to emit green light.

The second embodiment of a multi-wavelength white light-emitting structure of the present invention also uses a UV light emitting diode chip that emits light having a wavelength between 350~430 nm to excite a red phosphor to emit red light having a wavelength between 600~700 nm. The present invention then uses a blue light emitting diode chip that emits light having a wavelength between 400~500 nm to emit blue light. The blue light emitting diode chip that emits light having a wavelength between 400~500 nm is then used to excite a green phosphor to emit green light having a wavelength between 490~560 nm and a yellow phosphor to emit yellow light having a wavelength between 550~600 nm. Mixing the red light, the blue light, the green light and the yellow light forms a white light.

The UV light emitting diode chip and the blue light emitting diode chip are made of a nitride compound semiconductor. The UV light emitting diode chip and the blue light emitting diode chip can be separated or integrated into a bi-wavelength single chip.

The chemical composition of red phosphor is $Y2O2S:Eu$, $YVO4:Eu$, $Y(V,P,B)O4:Eu$, $YnbO4:Eu$, $YtaO4:Eu$ or other phosphors that can be excited by UV light to emit red light. The chemical composition of green phosphor is $SrGa_2S_4:Eu$, $Ca_8EuMnMg(SiO_4)C_{12}$ or other phosphors that can be excited by blue light to emit green light. The chemical composition of yellow phosphor is YAG:Ce, TbAG:Ce or other phosphors that can be excited by blue light to emit yellow light.

The third embodiment of a multi-wavelength white light-emitting structure of the present invention further uses a UV light emitting diode chip that emits light having a wavelength between 350~430 nm to excite a red phosphor to emit red light having a wavelength between 600~700 nm and a green phosphor to emit green light having a wavelength between 490~560 nm. The present invention then uses a blue light emitting diode chip that emits light having a wavelength between 400~500 nm to emit blue light. Mixing the red light, the blue light and the green light forms a white light.

The UV light emitting diode chip and the blue light emitting diode chip are made of a nitride compound semiconductor. The UV light emitting diode chip and the blue light emitting diode chip can be separated or integrated into a bi-wavelength single chip.

The chemical composition of red phosphor is $Y2O2S:Eu$, $YVO4:Eu$, $Y(V,P,B)O4:Eu$, $YnbO4:Eu$, $YtaO4:Eu$ or other phosphors that can be excited by UV light to emit red light. The chemical composition of green phosphor is $SrGa_2S_4:Eu$, $Ca_8EuMnMg(SiO_4)C_{12}$ or other phosphors that can be excited by blue light to emit green light.

The fourth embodiment of a multi-wavelength white light-emitting structure of the present invention further uses a UV light emitting diode chip that emits light having a wavelength between 350~430 nm to excite a red phosphor to emit red light having a wavelength between 600~700 nm and a green phosphor to emit green light having a wavelength between 490~560 nm. The present invention then uses a blue light emitting diode chip that emits light having a wavelength between 400~500 nm to emit blue light. The blue light emitting diode chip that emits light having a wavelength between 400~500 nm is then used to excite a yellow phosphor to emit yellow light having a wavelength between 550~600 nm. Mixing the red light, the blue light, the green light and the yellow light forms a white light.

The UV light emitting diode chip and the blue light emitting diode chip are made of a nitride compound semiconductor. The UV light emitting diode chip and the blue light emitting diode chip can be separated or integrated into a bi-wavelength single chip.

The chemical composition of red phosphor is $Y2O2S:Eu$, $YVO4:Eu$, $Y(V,P,B)O4:Eu$, $YnbO4:Eu$, $YtaO4:Eu$ or other phosphors that can be excited by UV light to emit red light. The chemical composition of green phosphor is $SrGa_2S_4:Eu$, $Ca_8EuMnMg(SiO_4)C_{12}$ or other phosphors that can be excited by blue light to emit green light. The chemical composition of yellow phosphor is YAG:Ce, TbAG:Ce or other phosphors that can be excited by blue light to emit yellow light.

The packaging type of a multi-wavelength white light-emitting structure of the present invention can be lamp, surface-mounted device (SMD) or chip on board (COB), etc.

The present invention has the following characteristics:

1. The lighting efficiency is excellent. The present invention adopts a short-wavelength light, such as a UV light emitting diode chip, to excite phosphor. As such, the lighting efficiency is increased.

2. The color rendering is good. The present invention uses a UV light emitting diode and a blue light emitting diode to excite a red phosphor and a green phosphor, and generate red light, green light and blue light. Mixing these three lights to obtain white light enhances the color rendering.

3. The number of phosphors that can be used is higher. The present invention utilizes the characteristics of light emitting diodes and phosphors to generate red light, green light and blue light. Through this method, the number of available options when choosing phosphors increases due to the fact that the limitations, based upon the absorbability index of phosphor, are smaller.

Figure 2:
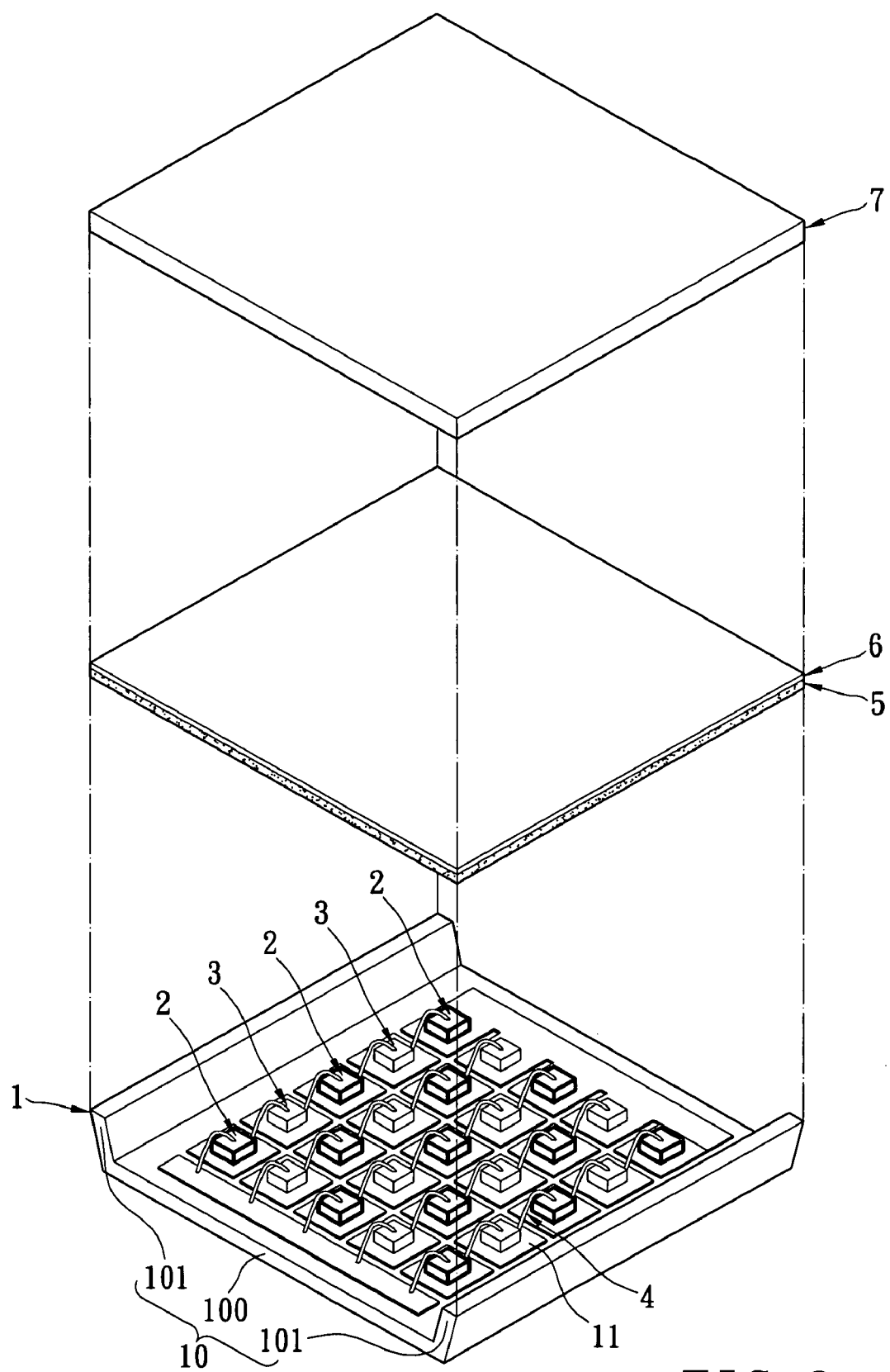
FIG. 2 is a perspective, exploded, schematic view of a white light-emitting structure of the present invention.
Figure 3:
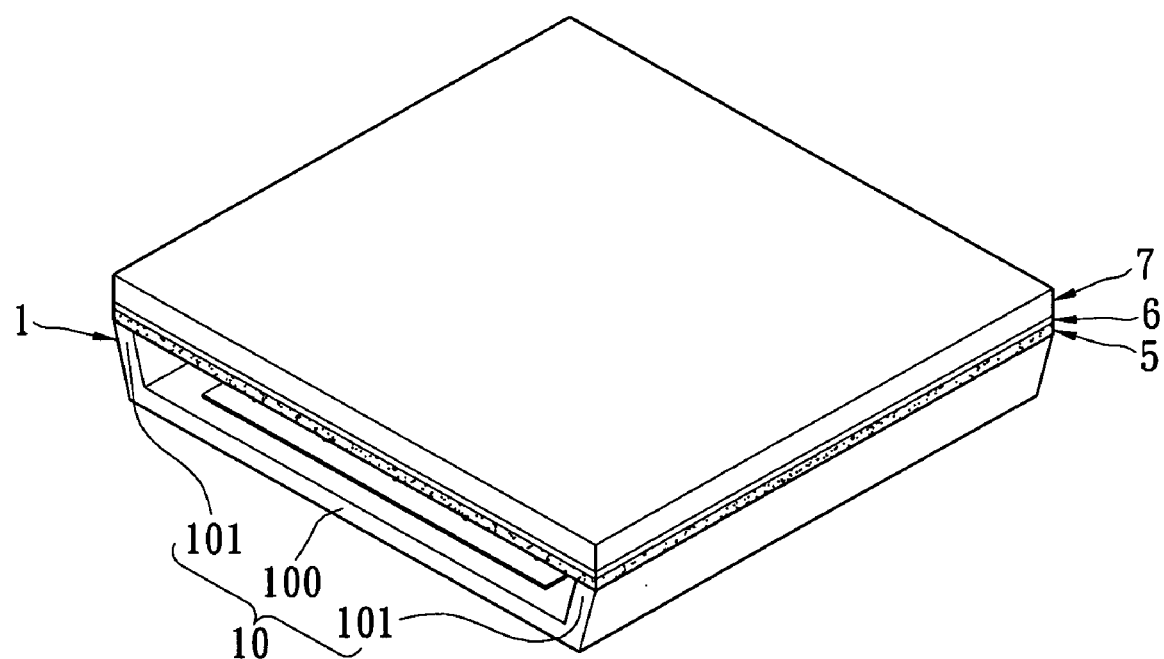
FIG. 3 is a perspective, assembled, schematic view of a white light-emitting structure of the present invention.
Figure 4:
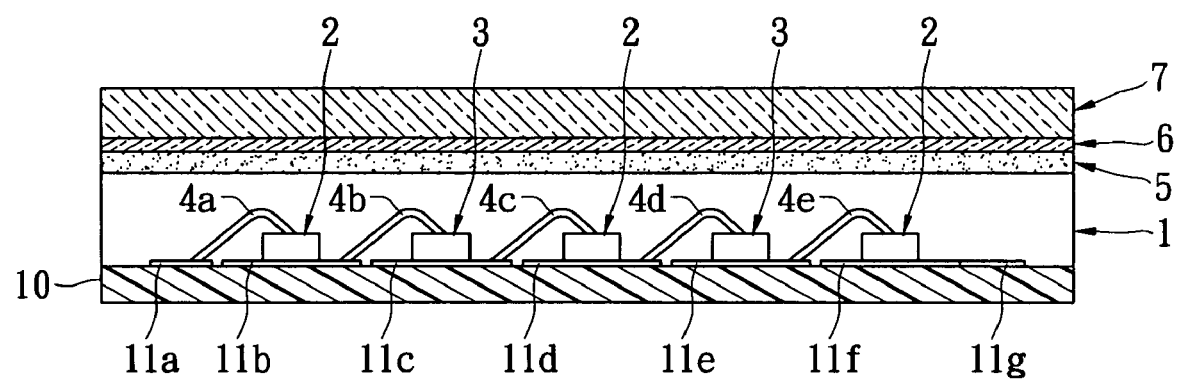
FIG. 4 is a lateral, cross-sectional, schematic view of a white light-emitting structure of the present invention.

Referring to FIGS. 2 to 4, the present invention provides a multi-wavelength white light-emitting structure, including: a lampshade 1, a plurality of UV light emitting diode chips 2, a plurality of blue light emitting diode chips 3, a plurality of wires 4 and a phosphor board 5.

The lampshade 1 has a body 10 and a plurality of reflective layers 11 formed on an inner surface of the body 10 and separated from each other. The body 10 has a U shape, and the body 10 has a substrate 100 and two oblique sides 101 disposed on two opposite ends of the substrate 100. In addition, each reflective layer can be made of metal material such as each reflective layer can be a silver layers.

Moreover, the UV light emitting diode chips 2 are respective electrically disposed on one part of the reflective layers 11, and the blue light emitting diode chips 3 are respective electrically disposed on other part of the reflective layers 11. In the present invention, the UV light emitting diode chips 2 and the blue light emitting diode chips 3 are alternately arranged on the reflective layers 11.

Furthermore, each wire 4 is transversely electrically connected between each light emitting diode chip (2 or 3) and each next reflective layer 11, so that each transverse row of the light emitting diode chips (2 and 3) is series-wound in order to a multiple-series connection.

For example, referring to FIG. 4, along the first row, the first chip, the third chip and the fifth chip are UV light emitting diode chips 2, and the second chip and the fourth chip are blue light emitting diode chips 3. In addition, the first wire 4a is transversely electrically connected between the light emitting diode chip 2 and the first reflective layer 11a, the second wire 4b is transversely electrically connected between the light emitting diode chip 3 and the second reflective layer 11b, the third wire 4c is transversely electrically connected between the light emitting diode chip 2 and the third reflective layer 11c, the fourth wire 4d is transversely electrically connected between the light emitting diode chip 3 and the fourth reflective layer 11d, and the fifth wire 4e is transversely electrically connected between the light emitting diode chip 2 and the fifth reflective layer 11e. In addition, the sixth reflective layer 11f and the seventh reflective layer 11g are electrically connected to each other.

Moreover, the phosphor board 5 is disposed on the body 10 of the lampshade 1.

In a first one aspect, when the phosphor board 5 is mixed by a red phosphor and a green phosphor, the red phosphor is excited by the UV light emitting diode chips 2 to emit red light, and the green phosphor is excited by the blue light emitting diode chips 3 to emit green light. Therefore, the red light, the green light and the blue light generated by the blue light emitting diode chips 3 are mixed to form white light.

In a second one aspect, when the phosphor board 5 is mixed by a red phosphor, a green phosphor and a yellow phosphor, the red phosphor is excited by the UV light emitting diode chips 2 to emit red light, the green phosphor is excited by the blue light emitting diode chips 3 to emit green light, and the yellow phosphor is excited by the blue light-emitting diode chips 3 to emit a yellow light. Therefore, the red light, the green light, the yellow light and the blue light generated by the blue light emitting diode chips 3 are mixed to form white light.

In a third one aspect, when the phosphor board 5 is mixed by a red phosphor and a green phosphor, the red phosphor is excited by the UV light emitting diode chips 2 to emit red light, and the green phosphor is excited by the UV light emitting diode chips 2 to emit green light. Therefore, the red light, the green light and the blue light generated by the blue light emitting diode chips 3 are mixed to form white light.

In a fourth one aspect, when the phosphor board 5 is mixed by a red phosphor, a green phosphor and a yellow phosphor, the red phosphor is excited by the UV light emitting diode chips 2 to emit red light, the green phosphor is excited by the UV light emitting diode chips 2 to emit green light, and the yellow phosphor is excited by the blue light-emitting diode chips 3 to emit a yellow light, wherein the red light, the green light, the yellow light and the blue light generated by the blue light emitting diode chips 3 are mixed to form white light.

Furthermore, a light-guiding board 6 is disposed on the phosphor board 5, and a LCD display 7 is disposed on the light-guiding board 6.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A multi-wavelength white light-emitting structure, comprising:
   a lampshade having a body and a plurality of reflective layers formed on an inner surface of the body and separated from each other;
   a plurality of UV light emitting diode chips respective electrically disposed on one part of the reflective layers;
   a plurality of blue light emitting diode chips respective electrically disposed on other part of the reflective layers, wherein the UV light emitting diode chips and the blue light emitting diode chips are alternately arranged on the reflective layers;
   a plurality of wires, and each wire transversely electrically connected between each light emitting diode chip and each next reflective layer, so that each transverse row of the light emitting diode chips is series-wound in order to a multiple-series connection; and
   a phosphor board disposed on the body of the lampshade.

2. The multi-wavelength white light-emitting structure of claim 1, wherein the body has a U shape.

3. The multi-wavelength white light-emitting structure of claim 1, wherein the body has a substrate and two oblique sides disposed on two opposite ends of the substrate.

4. The multi-wavelength white light-emitting structure of claim 1, wherein each reflective layer is a silver layers.

5. The multi-wavelength white light-emitting structure of claim 1, wherein the phosphor board is mixed by a red phosphor and a green phosphor, the red phosphor is excited by the UV light emitting diode chips to emit red light, and the green phosphor is excited by the blue light emitting diode chips to emit green light, wherein the red light, the green light and the blue light generated by the blue light emitting diode chips are mixed to form white light.

6. The multi-wavelength white light-emitting structure of claim 1, wherein each UV light emitting diode chip is made of a nitride compound semiconductor.

7. The multi-wavelength white light-emitting structure of claim 1, wherein each blue light emitting diode chip is made of a nitride compound semiconductor.

8. The multi-wavelength white light-emitting structure of claim 1, wherein the phosphor board is mixed by a red phosphor, a green phosphor and a yellow phosphor, the red phosphor is excited by the UV light emitting diode chips to emit red light, the green phosphor is excited by the blue light emitting diode chips to emit green light, and the yellow phosphor is excited by the blue light-emitting diode chips to emit a yellow light, wherein the red light, the green light, the yellow light and the blue light generated by the blue light emitting diode chips are mixed to form white light.

9. The multi-wavelength white light-emitting structure of claim 1, wherein the phosphor board is mixed by a red phosphor and a green phosphor, the red phosphor is excited by the UV light emitting diode chips to emit red light, and the green phosphor is excited by the UV light emitting diode chips to emit green light, wherein the red light, the green light and the blue light generated by the blue light emitting diode chips are mixed to form white light.

10. The multi-wavelength white light-emitting structure of claim 1, wherein the phosphor board is mixed by a red phosphor, a green phosphor and a yellow phosphor, the red phosphor is excited by the UV light emitting diode chips to emit red light, the green phosphor is excited by the UV light emitting diode chips to emit green light, and the yellow phosphor is excited by the blue light-emitting diode chips to emit a yellow light, wherein the red light, the green light, the yellow light and the blue light generated by the blue light emitting diode chips are mixed to form white light.

11. The multi-wavelength white light-emitting structure of claim 5, wherein the chemical composition of the red phosphor is Y2O2S:Eu, YVO4:Eu, Y(V,P,B)O4:Eu, YnbO4:Eu or YtaO4:Eu, and the chemical composition of the green phosphor is $SrGa_2S_4$:Eu or $Ca_8EuMnMg(SiO_4)C_{12}$.

12. The multi-wavelength white light-emitting structure of claim 5, wherein the wavelength of the red light is between 600~700 nm, and the wavelength of the red light is between 490~560 nm.

13. The multi-wavelength white light-emitting structure of claim 8, wherein the chemical composition of the yellow phosphor is YAG:Ce or TbAG:Ce, and the wavelength of the yellow light is between 550~600 nm.

* * * * *